United States Patent
Binzer et al.

(10) Patent No.: US 9,797,989 B2
(45) Date of Patent: Oct. 24, 2017

(54) SEMICONDUCTOR MODULE HAVING INTEGRATED ANTENNA STRUCTURES

(71) Applicant: Robert Bosch GmbH, Stuttgart (DE)

(72) Inventors: Thomas Binzer, Ingersheim (DE); Delf Mittelstrass, Friolzheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 526 days.

(21) Appl. No.: 14/381,953

(22) PCT Filed: Jan. 18, 2013

(86) PCT No.: PCT/EP2013/050930
§ 371 (c)(1),
(2) Date: Aug. 28, 2014

(87) PCT Pub. No.: WO2013/127562
PCT Pub. Date: Sep. 6, 2013

(65) Prior Publication Data
US 2015/0061924 A1 Mar. 5, 2015

(30) Foreign Application Priority Data
Feb. 29, 2012 (DE) .................. 10 2012 203 151

(51) Int. Cl.
*G01S 7/02* (2006.01)
*G01S 7/03* (2006.01)
(Continued)

(52) U.S. Cl.
CPC ............... *G01S 7/02* (2013.01); *G01S 7/032* (2013.01); *H01L 21/50* (2013.01); *H01L 23/66* (2013.01);
(Continued)

(58) Field of Classification Search
CPC ...... G01S 7/02; G01S 7/032; G01S 2007/027; H01L 21/50; H01L 24/19; H01L 23/66;
(Continued)

(56) References Cited

U.S. PATENT DOCUMENTS 7,518,553 B2 *  4/2009  Zhang ..................... H01Q 1/38
                                                    343/700 MS
7,692,588 B2 *  4/2010  Beer ....................... G01S 7/032
                                                    257/690
(Continued)

FOREIGN PATENT DOCUMENTS

| CN | 1937225 A | 3/2007 |
|----|-----------|--------|
| CN | 102217064 A | 10/2011 |
| DE | 10 2010 001407 | 9/2010 |

OTHER PUBLICATIONS

International Search Report for PCT/EP2013/050930, dated Apr. 18, 2013.

*Primary Examiner* — Matthew M Barker
(74) *Attorney, Agent, or Firm* — Norton Rose Fulbright US LLP; Gerard Messina

(57) ABSTRACT

A semiconductor module has: an integrated circuit, which includes at least one oscillator for generating a radar signal; a rewiring layer for the external connection of the integrated circuit; and at least two antenna structures integrated into the semiconductor module for transmitting and/or receiving radar signals, at least one of the at least two antenna structures being connected to the integrated circuit, and at least one first one of the antenna structures being embedded in a housing material of the semiconductor module outside a height region of the rewiring layer.

12 Claims, 3 Drawing Sheets

(51) Int. Cl.
    *H01L 23/66* (2006.01)
    *H01L 23/00* (2006.01)
    *H01L 21/50* (2006.01)
    *H01Q 23/00* (2006.01)

(52) U.S. Cl.
    CPC ........ *H01L 24/19* (2013.01); *G01S 2007/027* (2013.01); *H01L 2223/6677* (2013.01); *H01L 2223/6683* (2013.01); *H01L 2224/12105* (2013.01); *H01L 2224/16225* (2013.01); *H01L 2924/18162* (2013.01); *H01Q 23/00* (2013.01)

(58) Field of Classification Search
    CPC ... H01L 2223/6683; H01L 2924/18162; H01L 2224/16225; H01L 2224/12105; H01L 2223/6677; H01Q 23/00
    See application file for complete search history.

(56) References Cited

U.S. PATENT DOCUMENTS

| | | | |
|---|---|---|---|
| 7,973,734 B2* | 7/2011 | Strempel | H01Q 1/30 29/600 |
| 2007/0200748 A1* | 8/2007 | Hoegerl | H01L 23/3128 342/85 |
| 2008/0105966 A1* | 5/2008 | Beer | G01S 7/032 257/690 |
| 2010/0133349 A1 | 6/2010 | Shingai | |
| 2010/0193935 A1 | 8/2010 | Lachner et al. | |

* cited by examiner

SEMICONDUCTOR MODULE HAVING INTEGRATED ANTENNA STRUCTURES

BACKGROUND OF THE INVENTION

1. Field of the Invention

The present invention relates to a semiconductor module, which includes an integrated circuit that encompasses at least one oscillator for generating a radar signal, and a rewiring layer for the external connection of the integrated circuit; it also has at least two antenna structures, which are integrated in the semiconductor module, for the transmission and/or reception of radar signals, at least one of the at least two antenna structures being connected to the integrated circuit. In particular, the present invention relates to such a semiconductor module for automotive radar applications. Furthermore, the present invention relates to a radar sensor having such a semiconductor module, and to an automotive radar system having a semiconductor module of this type.

2. Description of the Related Art

Radar sensors are used for measuring the distance and/or speed of objects. Known in particular are radar systems in which speeds and distances of multiple objects are recorded simultaneously. For example, vehicle speed controllers for vehicles equipped with a radar system for locating a vehicle driving ahead and for measuring the distance to this vehicle are known. Such a distance control system is also referred to as an ACC system (Adaptive Cruise Control).

To simplify the configuration of HF circuits for radar applications, integrated microwave circuits of the MMIC type (Microwave Monolithic Integrated Circuit) are increasingly used for the transmit and receive circuits.

Wafer assemblies are known in which the component is produced with a rewiring layer for an IC component at the wafer level. Such a wafer component assembly is also called an embedded grid array at the wafer level (eWLB, embedded wafer level ball grid array).

Published German patent application document DE 10 2010 001 407 A1 describes a semiconductor module in which antennas are integrated at the wafer level. The semiconductor module includes a first housing molding mass layer and an IC component having an integrated circuit in which the first housing molding mass layer is embedded. An intermediate layer includes a rewiring layer, which is connected to the IC component and used for the external connection of the IC component. An integrated antenna structure is situated within the intermediate layer and connected to the IC component. Such a semiconductor module may be produced with a degree of precision that is suitable for the high-frequency range of 77 GHz, for example. An eWLB semiconductor module of this type including antennas that are integrated into the housing is also referred to as an antenna in package (AiP). In one example, the integrated antenna structure is a patch antenna, and an additional second antenna structure in the form of a parasitic microstrip patch antenna is situated on the surface of the semiconductor module, the second antenna structure oscillating at a slightly lower frequency and thus having the capability of increasing the impedance width of the integrated antenna structures.

BRIEF SUMMARY OF THE INVENTION

In an eWLB semiconductor module provided with an integrated circuit and integrated antenna structures, the integrated antenna structure disposed in one plane results in a small bandwidth. However, for automotive radar applications, especially FMCW radar systems (Frequency Modulated Continuous Wave), it is desirable to have broadband antenna structures.

It is the object of the present invention to make available a novel semiconductor module for radar applications, which makes it possible to supply an antenna that has better bandwidth.

In the present invention, this objective is achieved by a semiconductor module of the type mentioned at the outset, in which at least a first one of the antenna structures is embedded in a housing material of the semiconductor module, outside a height region of the rewiring layer.

The housing material preferably is a housing molding mass, i.e., a shaped material or casting material that forms the housing for the integrated circuit.

Embedding one or multiple first antenna structure(s) in the housing material of the semiconductor module makes it possible to freely predefine positions and a height clearance of the antenna structures, in particular. In addition, antenna structures are able to be stacked on top of one another at more than two different heights, which results in better options for defining the bandwidth and, if applicable, the directional characteristic of an antenna formed by the antenna structures. For example, during the manufacture of the semiconductor module, the housing material may be applied in two or more partial layers, between which an antenna structure is able to be affixed, e.g., in a metallization layer.

The at least one first antenna structure preferably is located at a different height than at least one of the second antenna structures.

The oscillator in particular is an oscillator for generating a radar signal having frequencies in the microwave range, i.e., decimeter, centimeter and/or millimeter waves.

Preferably, the semiconductor module has a wafer unit and an interface layer, the wafer unit having a semiconductor chip, which forms the integrated circuit, as well as a housing layer, which is embodied by the housing material of the semiconductor module and in which the semiconductor chip and the at least one first antenna structure are embedded; the interface layer has the rewiring layer which connects the integrated circuit to external terminals of the interface layer. The semiconductor module preferably is an eWLB package.

Preferably, the at least one second antenna structure is situated within the height range of the rewiring layer. In especially preferred manner, the at least one second antenna structure is disposed in said interface layer. For example, the second antenna structure is able to be produced together with the rewiring layer, in one method step. The at least one second antenna structure is situated in the rewiring layer, for instance. As an example, the at least one second antenna structure may be connected to the integrated circuit via the rewiring layer.

The antenna structures preferably are stacked antenna structures, that is to say, they are situated on top of one another at a height offset. This allows an especially advantageous adjustment of the antenna characteristics.

Preferably, the antenna structures are laterally offset from said semiconductor chip. In especially preferred manner, the at least one first antenna structure is laterally offset in relation to the semiconductor chip and disposed in a region laterally next to the semiconductor chip in the housing layer. For example, multiple antenna structures may be positioned at a lateral offset from the semiconductor chip at different levels in a region next to the semiconductor chip in the housing layer. At least one second antenna structure, for instance, may be situated at a lateral offset from the semiconductor chip, in a region outside of the semiconductor chip in the interface layer. The wafer unit and the interface layer extend in parallel, for instance, the interface layer extending across a region of the semiconductor chip and across a region that lies outside of this area.

The objective is furthermore achieved by a method for producing a semiconductor module having integrated antenna structures for radar signals, the method encompassing the following steps:

Furnishing a semiconductor chip in the form of an integrated circuit, which includes at least one HF oscillator; and Producing a housing layer of a housing of the semiconductor module, the housing layer at least laterally abutting the semiconductor chip, and the production of the housing layer encompassing the steps of:

producing a partial layer of the housing layer;

producing at least one first antenna structure on the partial layer; and producing a further partial layer of the housing layer that covers the first antenna structure;

the method furthermore encompassing the steps:

producing at least one second antenna structure, which is integrated into the semiconductor module; and producing a rewiring layer on at least one surface of the housing layer.

Preferably, the at least one second antenna structure is produced at a different height level than the first antenna structure.

DETAILED DESCRIPTION OF THE INVENTION

Figure 1:
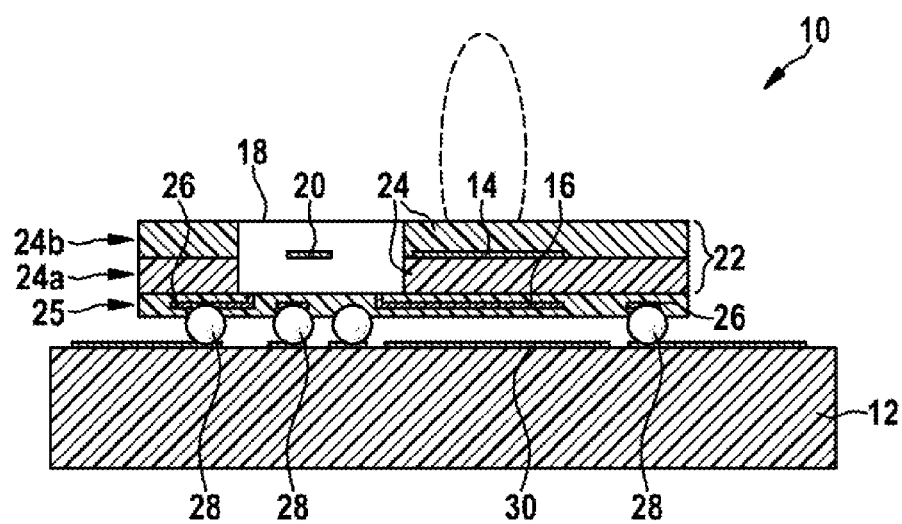
FIG. 1 shows a schematic cross-sectional view of a semiconductor module having two integrated antenna structures.

FIG. 1 schematically shows a cross-sectional view of a semiconductor module 10, which has been mounted on a circuit board 12.

Semiconductor module 10 includes a first integrated antenna structure 14, a second integrated antenna structure 16, and an integrated circuit 18 embodied in the form of a semiconductor chip. Integrated circuit 18 includes the HF component of a transmit and receive circuit for radar signals and is connected to second antenna structure 16. In particular, integrated circuit 18 includes an HF oscillator 20 for generating a radar signal to be emitted by antenna elements 14, 16. As usual, integrated circuit 18 additionally is equipped with a mixer for mixing a radar signal received via antenna structures 14, 16, with the transmitted signal. Integrated circuit 18 is a so-called MMIC chip (Monolithic Microwave Integrated Circuit).

Semiconductor module 10 is what is known as an eWLB package, in which a wafer unit 22 includes the semiconductor chip which forms integrated circuit 18, and a housing molding mass layer in the form of a housing layer 24, in which the semiconductor chip is embedded. This wafer unit 22 assembled during the production is also known as reconstituted wafer. Wafer unit 22 is provided with an interface layer 25, which includes a rewiring layer 26 and connections 28 embodied in the form of 3D connection structures, especially balls of solder. On a first side, rewiring layer 26 has contact points which are in contact with contact points of wafer unit 22. On a second side, rewiring layer 26 is linked to connections 28 for the external contacting. This connects integrated circuit 18 to connections 28 of interface layer 25. By way of example, FIG. 1 shows four terminals 28, which are connected to circuit tracks of three circuit boards 12. Semiconductor module 10 is able to be mounted on circuit board 12 with the aid of standard processes, especially surface-mounting processes.

Second antenna structure 16 is integrated into interface layer 25 at the height region of rewiring layer 26 and connected to integrated circuit 18 in the interface layer. More specifically, second antenna structure 16 and the connection to integrated circuit 18 are integrated into interface layer 25 as part of rewiring layer 26.

Second antenna structure 16 is laterally offset with respect to the semiconductor chip and thus lies in the region next to housing layer 24, outside a region of interface layer 24 that is adjacent to the semiconductor chip.

First antenna structure 14 is embedded laterally next to the semiconductor chip in housing layer 24, with clearance from second antenna structure 16 in the height direction. First and second antenna structures 14, 16 consequently form a stacked antenna array. In the following text, a method for producing the semiconductor module will be described by way of example on the basis of FIG. 4.

In the example described, first antenna structure 14 is not electrically connected, but excited via electromagnetic coupling. However, first antenna structure 14 may also be connected to integrated circuit 18, possibly by way of at least one through-contacting (Via) in a partial layer of housing layer 24.

For example, first and second antenna structures 14, 16 have slightly different resonance characteristics, especially different resonant frequency ranges, which may be realized by different dimensions of first and second antenna structures 14, 16, for instance. This increases the broadband characteristics of the resonance range of the antenna made up of antenna structures 14, 16 in comparison with the individual antenna structure 16.

Using dashed lines, FIG. 1 shows a main radiation direction of the antenna formed by antenna structures 14, 16, perpendicular to wafer unit 22.

Antenna structures 14, 16, for example, may include patch antenna elements. However, antenna structures 14, 16 may also include other antenna elements such as printed dipole antenna elements, especially electrical or magnetic dipoles. Antenna structures 14, 16, for example, extend in a single plane.

In the example illustrated, circuit board 12 is optionally provided with a reflector 30 embodied as a conductive region on a side lying opposite the main radiation direction.

Integrating antenna structures 14, 16 into the semiconductor module produced with the antenna in the housing at the wafer level (antenna in package AiP) allows a precise connection to antenna structure 16 which is connected to integrated circuit 18, and a precise alignment of antenna structures 14, 16 with respect to one another. An especially efficient production is possible. In the example described, the characteristic of the resonance bandwidth is able to be adjusted in precisely definable manner through first antenna structure 14, which is operated as parasitic antenna structure.

In the example shown, first and second antenna structures 14, 16 may be used for the transmission and reception of radar signals. However, it is also conceivable to provide multiple second antenna structures 16 and/or multiple first antenna structures 14. In particular, there is the option of providing multiple second antenna structures 16 next to each other, at the same level, and the option of providing multiple first antenna structures 14 next to each other, at the same level, and it is possible to provide separate antenna structures for the transmission and reception.

Figure 2:
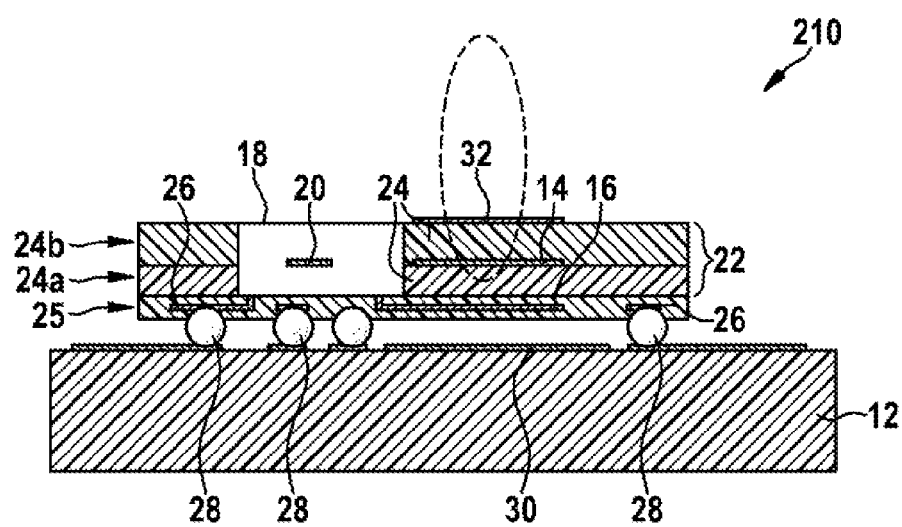
FIG. 2 shows a schematic cross-sectional view of a semiconductor module having three integrated antenna structures.

FIG. 2 shows a further example of a semiconductor module 210, which differs from the described semiconductor module 10 of FIG. 1 insofar as a third antenna structure 32 is mounted on a surface of wafer unit 22. Matching components of semiconductor module 10 and 210 have been marked by the same reference numerals.

In the illustrated example, third antenna structure 32 is not electrically connected. Instead, similar to first antenna structure 14, it is excited by first and second antenna structures 14, 16 via electromagnetic coupling. The resonance characteristics of antenna structures 14, 16, 32 differ, for example, so that first and third antenna structures 14, 32 increase the broadband capacity of the antenna made up of the antenna structures.

Figure 3:
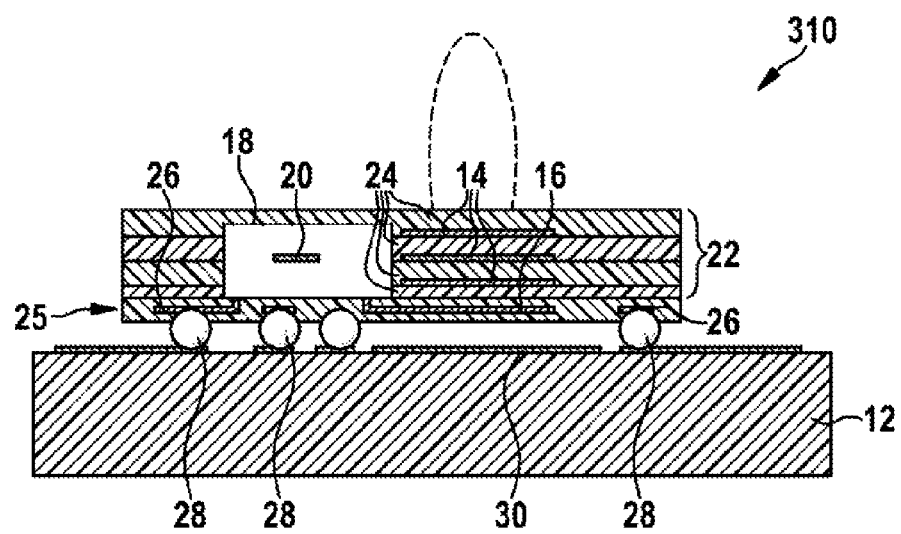
FIG. 3 shows a schematic cross-sectional view of a semiconductor module having four integrated antenna structures.

FIG. 3 shows another exemplary embodiment of a semiconductor module 310; it differs from semiconductor module 10 according to FIG. 1 in that multiple first antenna structures 14 are embedded in the housing molding mass of the semiconductor module, at different heights outside a height range of the rewiring layer. The other features and components are the same as in the example of FIG. 1, for instance, and have been designated using the same reference numerals.

In the example of FIG. 3, housing layer 24 extends across a side of integrated circuit 18 that lies opposite rewiring layer 26. Integrated circuit 18 therefore is surrounded by interface layer 25 and housing layer 24 on all sides.

Figure 4:
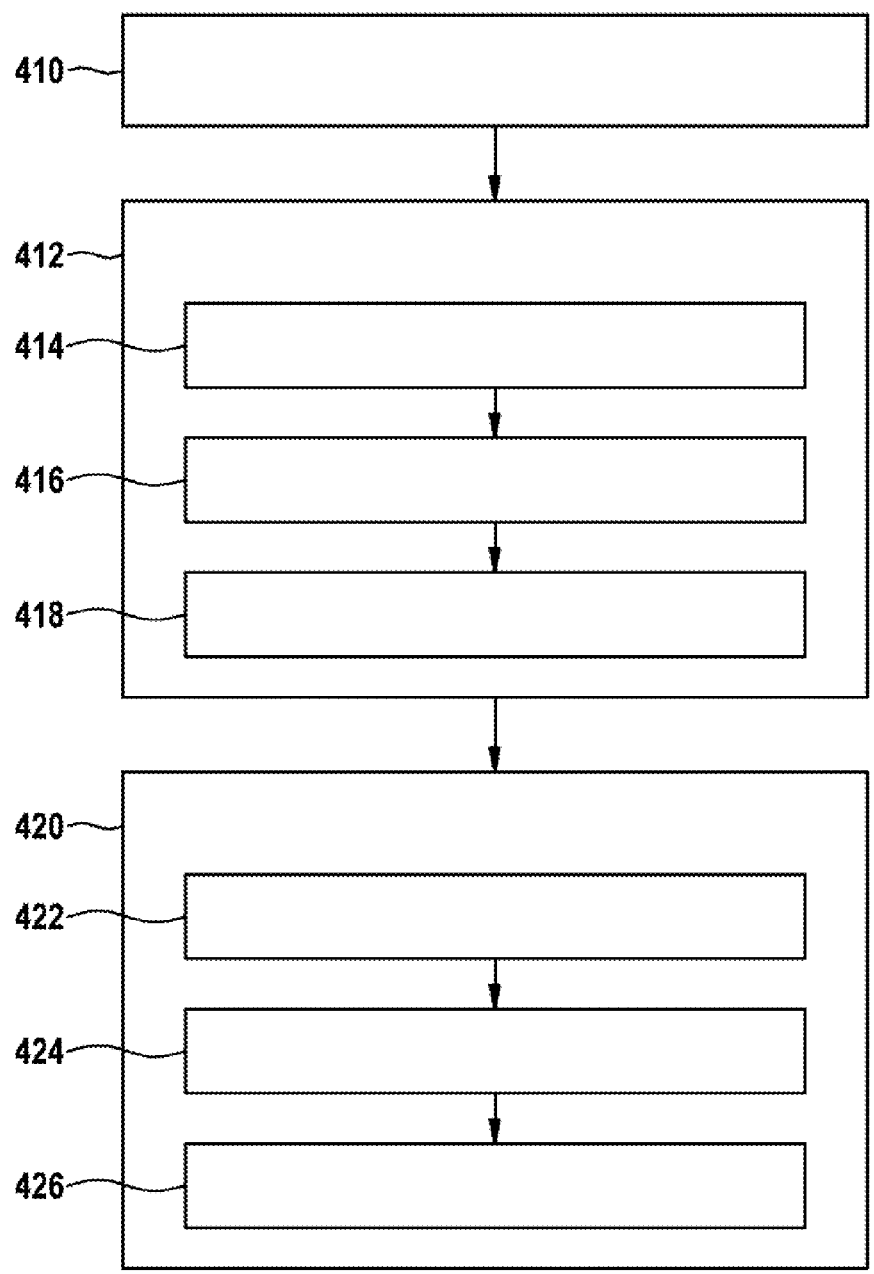
FIG. 4 shows a flow chart which illustrates a method for producing a semiconductor module.

In the following text, a production method for an afore-described semiconductor module will be explained with the aid of FIG. 4 using the production of semiconductor module 10 as an example.

In a first step 410, integrated circuit 18 is made available in the form of a semiconductor chip having integrated HF oscillator 20.

In a step 412, housing layer 24 of the housing of semiconductor module 10 is produced, the layer abutting the semiconductor chip at least along the side. The step of producing housing layer 24 encompasses a step 414 in which at least a first partial layer 24a (FIG. 1) of housing layer 24 is created; a step 416 in which at least one first antenna structure 14 is created in a metallization layer on partial layer 24a; and a step 418 in which a further partial layer 24b, covering first antenna structure 14, of housing layer 24 is produced. Steps 416 and 418 may be implemented repeatedly to produce multiple first antenna structures 14 at different levels within housing layer 24, e.g., in order to produce semiconductor module 310 according to FIG. 3.

In addition, the method encompasses step 420 of producing an interface layer 25, including step 422 in which a rewiring layer 26 is created, step 424 in which second antenna structure 16 is produced as part of interface layer 25, and optionally, a step 426 in which a connection structure having external connections 28 is created, which, for example, are connected to integrated circuit 18 via rewiring layer 26.

Deviating from the described examples, step 424 of producing a second antenna structure 16 may also take place within step 412 for producing the housing layer. In other words, second antenna structure 16 optionally is likewise situated outside the height region of interface layer 25. Second antenna structure 16 is always situated at a different height level from first antenna structure 14. For example, it may just as well be mounted on a surface of housing layer 14 in a similar manner as antenna structure 32 according to the example of FIG. 2.

What is claimed is:

1. A semiconductor module, comprising:
   an integrated circuit which includes at least one oscillator for generating a radar signal;
   a rewiring layer for an external connection of the integrated circuit; and
   at least two antenna structures integrated into the semiconductor module for at least one of transmission and reception of radar signals, at least one first one of the antenna structures being embedded in a housing material of the semiconductor module, outside of a height region of the rewiring layer, the housing material including a plurality of layers and the at least one first antenna structure being disposed between the plurality of layers,
   wherein the at least one first one of the antenna structures is not electrically connected to the integrated circuit and is excited via electromagnetic coupling, and
   wherein at least one second one of the at least two antenna structures is electrically connected to the integrated circuit.

2. The semiconductor module as recited in claim 1, wherein the at least one first antenna structure is situated at a different height from the at least one second one of the antenna structures.

3. The semiconductor module as recited in claim 2, wherein the at least one second one of the antenna structures is situated at a height range of the rewiring layer.

4. The semiconductor module as recited in claim 3, wherein the semiconductor module has a wafer unit and an interface layer, the wafer unit including (i) a semiconductor chip which embodies the integrated circuit, and (ii) a housing layer which is embodied by said housing material of the semiconductor module and in which the semiconductor chip and the at least one first antenna structure are embedded, and wherein the interface layer has the rewiring layer, which connects the integrated circuit to external connections of the interface layer.

5. The semiconductor module as recited in claim 4, wherein the at least one second one of the antenna structures is situated in the interface layer.

6. The semiconductor module as recited in claim 4, wherein the at least two antenna structures are stacked antenna structures.

7. The semiconductor module as recited in claim 4, wherein the at least two antenna structures are situated at a lateral offset from the integrated circuit.

8. The semiconductor module as recited in claim 4, wherein the at least one first antenna structure is embedded in a region laterally next to the semiconductor chip in said housing material of the semiconductor module, at a lateral offset from the semiconductor chip forming the integrated circuit.

9. The semiconductor module as recited in claim 8, wherein the at least two antenna structures are integrated into the semiconductor module and are embedded in said housing material of the semiconductor module at a lateral offset from the semiconductor chip which forms the integrated circuit, in a region laterally next to the semiconductor chip.

10. The semiconductor module as recited in claim 1, wherein the at least one first antenna structure includes a plurality of antenna structures.

11. A method for producing a semiconductor module having integrated antenna structures for radar signals, comprising:
   providing a semiconductor chip in the form of an integrated circuit, which includes at least one high-frequency oscillator;
   producing a housing layer of a housing of the semiconductor module, the housing layer at least laterally abutting the semiconductor chip, wherein the production of the housing layer includes:
   producing a partial layer of the housing layer;
   producing at least one first antenna structure on the partial layer; and
   producing a further partial layer of the housing layer, which covers the first antenna structure, the further partial layer being disposed on a surface of the partial layer, wherein the at least one first antenna structure is disposed between the partial layer and the further partial layer of the housing layer;
   producing at least one second antenna structure integrated into the semiconductor module; and
   producing a rewiring layer at least on one surface of the housing layer,
   wherein the at least one first antenna structure is not electrically connected to the integrated circuit and is excited via electromagnetic coupling, and
   wherein the at least one second antenna structure is electrically connected to the integrated circuit.

12. The semiconductor module as recited in claim 10, wherein the at least one first antenna structure includes a plurality of antenna structures.

* * * * *